US009344579B2

United States Patent
Lu et al.

(10) Patent No.: US 9,344,579 B2
(45) Date of Patent: May 17, 2016

(54) VARIABLE STEP SIZE ECHO CANCELLATION WITH ACCOUNTING FOR INSTANTANEOUS INTERFERENCE

(71) Applicants: Youhong Lu, Redmond, WA (US); Syavosh Zad Issa, Kirkland, WA (US)

(72) Inventors: Youhong Lu, Redmond, WA (US); Syavosh Zad Issa, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/321,811

(22) Filed: Jul. 2, 2014

(65) Prior Publication Data

US 2016/0006880 A1    Jan. 7, 2016

(51) Int. Cl.
| | |
|---|---|
| H04M 9/08 | (2006.01) |
| H04B 3/23 | (2006.01) |
| H04M 3/00 | (2006.01) |
| H03H 21/00 | (2006.01) |
| G10L 21/0208 | (2013.01) |

(52) U.S. Cl.
CPC .............. *H04M 9/082* (2013.01); *H04B 3/23* (2013.01); *H04M 3/002* (2013.01); *H04M 9/085* (2013.01); *G10L 21/0208* (2013.01); *H03H 2021/0078* (2013.01); *H04B 3/234* (2013.01)

(58) Field of Classification Search
None
See application file for complete search history.

(56) References Cited

U.S. PATENT DOCUMENTS

| | | | |
|---|---|---|---|
| 5,631,900 A | 5/1997 | McCaslin et al. | |
| 6,137,882 A | 10/2000 | Eriksson et al. | |
| 6,947,550 B2 * | 9/2005 | Xiong | H04M 9/082 379/406.01 |
| 7,346,012 B2 | 3/2008 | Stopler | |
| 8,073,133 B2 | 12/2011 | Ishiguro et al. | |
| 2002/0041678 A1 | 4/2002 | Basburg-Ertem et al. | |
| 2007/0223731 A1 * | 9/2007 | Togami et al. | 381/92 |
| 2008/0101622 A1 * | 5/2008 | Sugiyama | 381/66 |
| 2009/0022074 A1 * | 1/2009 | Brox | 370/286 |
| 2009/0265169 A1 * | 10/2009 | Dyba et al. | 704/233 |
| 2012/0250852 A1 | 10/2012 | Rowley | |

OTHER PUBLICATIONS

Gansler, et al., "Double-Talk Robust Fast Converging Algorithms for Network Echo Cancellation", In IEEE Workshop on Applications of signal processing to Audio and Acoustics, Oct. 17, 1999, pp. 215-218.
Wang, et al., "A Double-talk Robust and Fast Converging Echo Canceller", In 5th International Conference on Information, Communications and Signal Processing, Dec. 6, 2005, pp. 1316-1319.
Park, et al., "DTD-Free Nonlinear Acoustic Echo Cancellation based on Independent Component Analysis", In Proceedings of Electronics Letters, vol. 46, No. 12, Jun. 10, 2010, 2 pages.

* cited by examiner

*Primary Examiner* — Simon Sing
*Assistant Examiner* — Jeffrey Lytle
(74) *Attorney, Agent, or Firm* — Judy Yee; Micky Minhas (57) ABSTRACT

Examples of the disclosure provide variable step size (VSS) adaptive echo cancellation in the presence of near-end noise such as dense double talk without using an explicit double talk detector and/or without using a dual-filter. During a conversation, the present value for an error signal is monitored. Based on the monitored present value for the error signal, a first function is determined. A second function is determined based on long-term statistics describing a reference signal, a near-end noise signal, and the error signal. An adaptation coefficient is calculated for the VSS adaptive filter based on the determined first function and the determined second function. The calculated adaptation coefficient is used in the VSS adaptive filter for echo cancellation against interference due to the near-end noise signal during the conversation.

20 Claims, 8 Drawing Sheets

VARIABLE STEP SIZE ECHO CANCELLATION WITH ACCOUNTING FOR INSTANTANEOUS INTERFERENCE

BACKGROUND

Echo cancellation (EC) is required in almost every device (e.g., cell phones, tablets, personal computers, BLUETOOTH brand communication headsets, conference speakerphones, and smart television etc.) receiving and/or producing sound to increase voice quality. Double talk detection is used in some existing systems to perform the EC. However, adaptation of EC in these existing systems is frozen in the presence of double talk. Some of the existing systems use variable step size (VSS) adaptive filtering to increase EC performance under background noise that is relatively low in level. However, the echo canceller in some of the existing systems does not converge when dense near-end double talk is detected, such as when a user at the near-end makes a phone call without turning off music thereby creating strong interference, at least because it is difficult to estimate interference when the echo canceller is not convergent. Further, in the case of low-level interference, the convergence slows down in the existing systems which leads to poor performance.

In particular, the approaches used by the existing systems to combat adaptive EC divergence in the presence of near-end speech explicitly use a double talk detector (DTD) and/or a dual-filter (e.g., foreground-background filter). While the DTD is an estimator with associated probability of miss and false alarms, the dual-filter adds a significant number of clock cycles to a processor and requires complex control logic to manage the two filters. Further, the performance of the existing systems is lacking in many environments and use cases such as when conferencing, using a speakerphone in loud and noisy environments, or other use cases where the echo path changes frequently.

SUMMARY

Examples of the disclosure provide a variable step size (VSS) echo cancellation system. During a conversation, a present value for an error signal is monitored. Based on the monitored present value for the error signal, a first function is determined. A second function is determined based on long-term statistics of a reference signal, a near-end noise signal, and the error signal. An adaptation coefficient is calculated for the VSS adaptive filter based on the determined first function and the determined second function. The calculated adaptation coefficient is used by the VSS adaptive filter for echo cancellation in the presence of interference due to the near-end noise signal during the conversation.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

Corresponding reference characters indicate corresponding parts throughout the drawings.

DETAILED DESCRIPTION

Referring to the figures, examples of the disclosure enable a variable step size (VSS) normalized least mean square (NLMS) framework that offers superior performance in the presence of strong and dense double talk, offers rapid convergence and offers low misalignment error for different echo return loss (ERL) and echo to interference ratios (EIRs). In particular, some examples of the disclosure use a single filter without any explicit double talk detector (DTD). In some examples, sparseness (e.g., in time and frequency domain) in a reference signal 302, a near-end noise signal 304, and an error signal 306 is exploited for updating an adaptation coefficient of the adaptive filter 312. Examples of the disclosure provide a continuous adaptation rate that evolves in time and frequency as a function of both a level of instantaneous (e.g., present or current) error signal 306 and long-term averages for the reference signal 302, the near-end noise signal 304, and the error signal 306.

For example, a first function e.g., function F1) is determined based on monitored instantaneous values for the error signal 306 and a second function (e.g., function F2) is determined based on long-term statistics 208 (such as long-term averages) for the reference signal 302, the near-end noise signal 304, and the error signal 306. Both the first function and the second function are used for calculating the adaptation coefficient for the adaptive filter 312. The combined effect of the first function and the second function is that the filter adapts when it should, even in the presence of large echo and/or constant or dense double talk, to produce improved performance over previous systems. For example, during voice communications, aspects of the disclosure are operable in the presence of single far-end talk, single near-end talk, and double talk.

The system described herein includes a VSS adaptive filter for echo cancellation that provides better performance in terms of convergence speed and depth of convergence (e.g., against misalignment errors) as well as stronger resilience to low echo to interference ratio, and echo path change. In addition to better performance over the previous systems, the cost of implementing the system as described herein is lower.

Aspects of the disclosure enable convergence of the VSS adaptive filter 312 in the echo canceller at least because the adaptive filter 312 adapts based on the present value of the error signal 306 (e.g. fluctuating due to sudden spurts in background noise) as well as based on the long-term statistics 208 (e.g., of the reference signal 302, the near-end noise signal 304, and/or the error signal 306. For example, the VSS adaptive filter 312 converges even in the absence or non-availability of the long-term statistics 208 (e.g., when strong interference is observed after an echo-only signal for a long time, when a device reboots, when a new conversation beings, or after other echo path changes). In some examples, the long-term statistics 208 may be available only for a limited time period and in such examples the use of the present value of the error signal 306 compensates for the limited availability or non-availability of the long-term statistics 208. Thus, the echo canceller, as per the aspects of the disclosure, converges better than previous systems even in the presence of constant double talk in the near-end noise signal 304.

A mixture of echo and interference is mostly sparse in both time domain as well as frequency domain. For a given frequency, sparseness in time refers to varying contribution of echo, near end speech, and noise over short periods of time. Further, for a given time instance, sparseness in the frequency domain refers to varying contributions of echo, near end speech, and/or noise as a function of frequency. While the transform domain is described in some examples as being the frequency domain, aspects of the disclosure are operable with any transform. Exemplary transform domains include, but are not limited to, short term Fourier transform, short term discrete cosine transform, short term wavelet transform, cepstral coefficients, filter banks (of any type), and/or Walsh-Hadamard transform.

Figure 1:
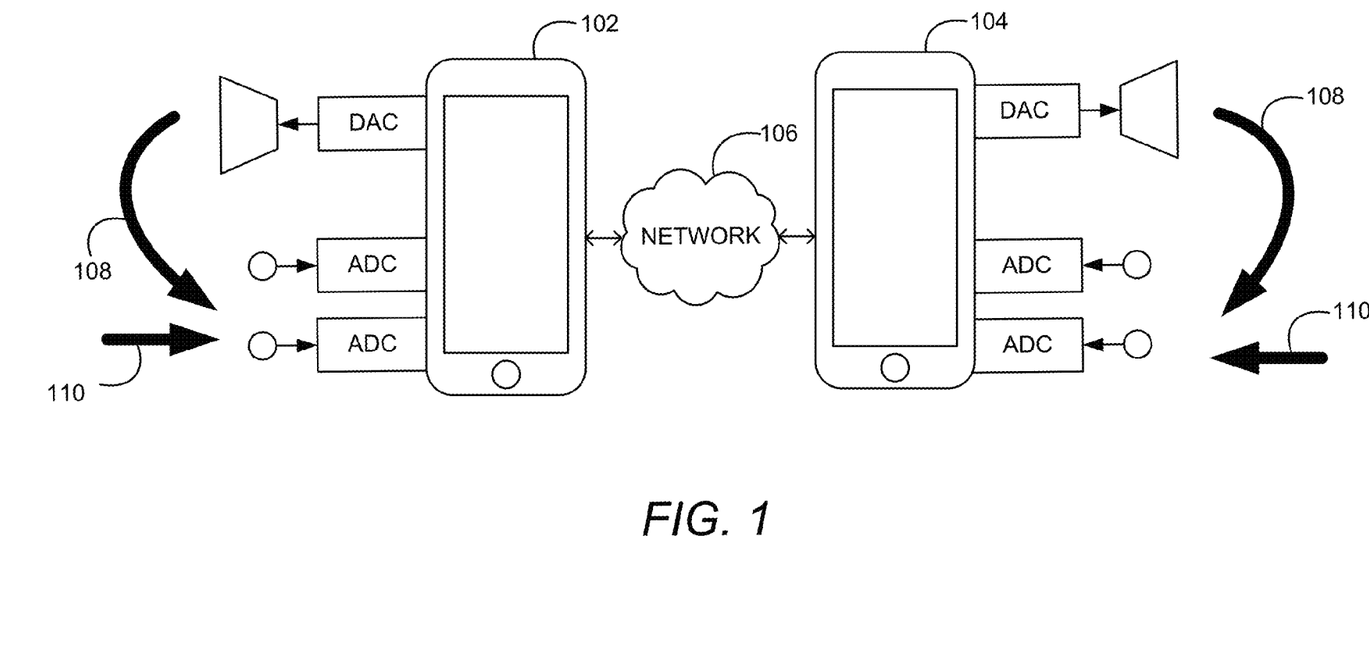
FIG. 1 is an exemplary block diagram illustrating an operating environment for acoustic echo cancellation in the presence of interference.

Referring again to FIG. 1, an exemplary block diagram illustrates an operating environment associated with aspects of the disclosure. In the example of FIG. 1, two computing devices 102, 104 are in communication through a network 106. A digital to analog converter (DAC) associated with each of computing devices 102 and 104 produces audio (e.g., speech) signal through speakers associated with the respective computing devices 102, 104. Analog to digital converters (ADC) associated with each of computing device 102 and 104 convert the audio (e.g., speech) signal for transmission through the network 106. Arrows 108 represent room impulse response (coupling and reflections) from outside and inside each of computing devices 102, 104. For example, without acoustic echo cancellation (AEC) for a user of the computing device 104, the signal represented by the arrows 108 and 110 in computing device 102 represent a far end signal. Further, for the user of the computing device 104, the signal represented by the arrows 108 and 110 in the computing device 104 represents a near-end signal. It is difficult for the previous systems to adapt to the effect of the interference, particularly in the case of dense double talk. Examples described herein offer acoustic echo cancellation using a single filter without using an explicit double talk detector. Further, one VSS may be selected dynamically (e.g., on the fly) from multiple, calculated VSS parameters. While the need for a dual-filter approach is removed in some examples as described herein, aspects of the disclosure are operable in conjunction with dual-filters.

The arrow 108 to the microphone forms echo that needs to be cancelled in the device. For example, the arrow 108 near computing device 104 forms echo which needs to be reduced at the computing device 104. In this example, if this echo is completely cancelled, the computing device 104 outputs to the network 106 only interference (e.g., signal 110) around the computing device 104. An ideal system should cancel the echo without distorting the interference. The interference and leaking echo (e.g., echo that is still left after cancellation) from one device received by the other device through the network 106 is called the reference signal 302 (or far end signal) in the other device. The arrows 110 represent respective near-end signals corresponding to the environment of the device (excluding from the loudspeaker).

Figure 2:
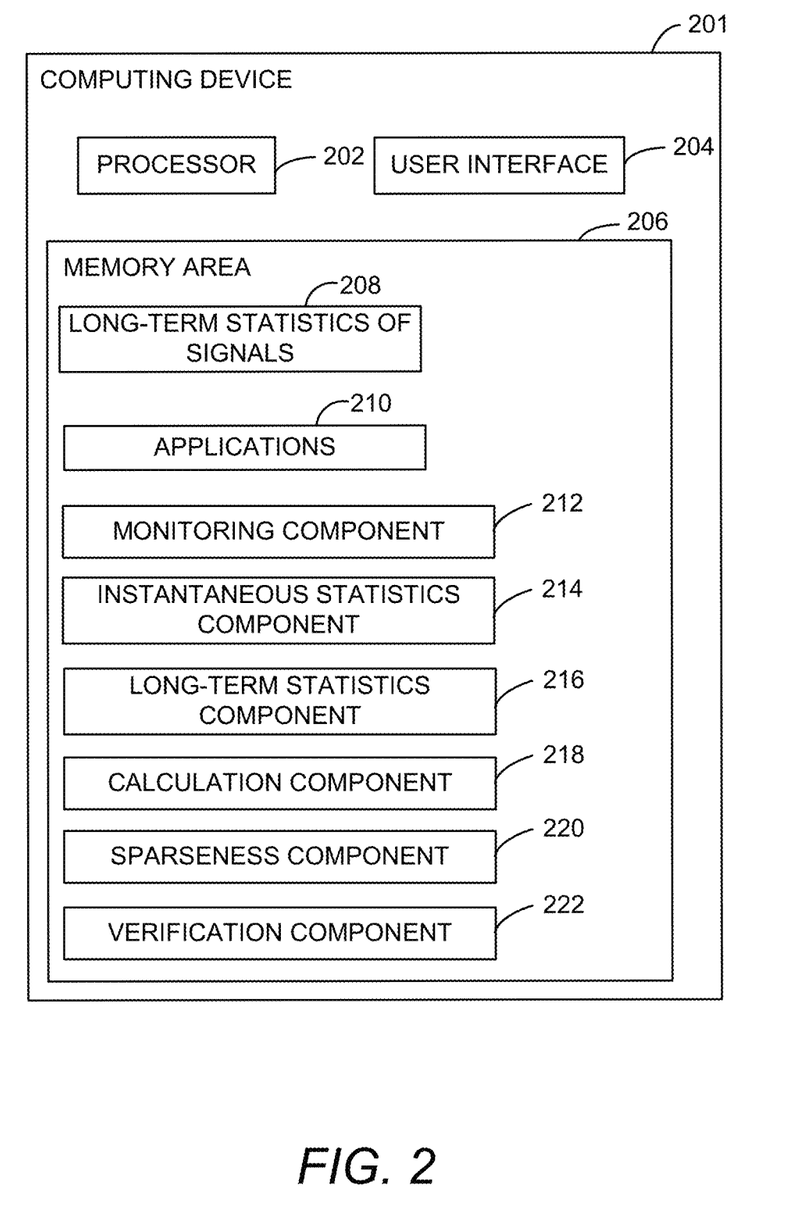
FIG 2 is an exemplary block diagram illustrating a computing device and components for implementing an acoustic echo cancellation system in the presence of interference.

Examples of the disclosure describe a system that is capable of converging in the presence of constant double talk using a VSS adaptive filter 312. In some embodiments, the system illustrated in FIG. 2 is implemented on either or both of the computing devices 102, 104 in the example of FIG. 1. The system includes a memory area (such as memory area 206 shown in FIG. 2) for storing the long-term statistics 208 describing the reference signal 302, the near-end noise signal 304, and the error signal 306. The long-term statistics 208 correspond to, for example, average values for the reference signal 302, the near-end noise signal 304, and the error signal 306 for at least a threshold time period. However, long-term statistics other than averages are contemplated. The threshold time period in one example occurs immediately before the monitoring of the present value for the error signal 306. In some examples, the long-term statistics 208 correspond to the average values of the reference signal 302, the near-end noise signal 304, and the error signal 306 since the beginning of the current conversation, over a predefined number of recent conversations, since a last reboot of the computing device, and/or since the computing device started monitoring (e.g., since the first conversation on the computing device).

The system also includes a processor (such as processor 202 shown in FIG. 2) which is programmed to monitor a present value for the error signal 306 during a conversation. A first function is determined based on the monitored present value for the error signal 306. A second function is determined based on the long-term statistics 208 stored in the memory area. The processor executes computer-executable instructions to calculate an adaptation coefficient for the VSS adaptive filter 312 based on the determined first function and the determined second function. The calculated adaptation coefficient is used in the adaptive filter 312 to reduce the effect of the near-end noise signal 304 during the conversation. In some examples, a previous adaptation coefficient is updated or replaced with the calculated adaptation coefficient in real-time. Thus, the VSS adaptive filter 312 converges in the presence of constant doable talk along with echo at least because the introduction of the constant double talk (at any instant or in real-time) is considered, as described herein, when calculating the adaptation coefficient.

Sparseness in the reference signal 302 and the near-end noise signal 304 is determined in both the time domain and the transform domain. The transform domain is the frequency domain in sonic examples, but may include other transform domains. In case of multiple microphones (e.g., two microphones), the sparseness is determined by considering a difference in magnitude and/or phase of echo signal for the at least two microphones, and/or a difference in magnitude and/or phase of a user's speech for the microphones.

Referring next to FIG. 2, an exemplary block diagram illustrates a computing device 201 having a memory area storing computer-executable components implementing a VSS NLMS algorithm for AEC as described herein. The computing device 201 represents any device executing instructions (e.g., as application programs, operating system functionality, or both) to implement the operations and functionality described herein. The computing device 201 may include a mobile computing device or any other portable device. In some examples, the mobile computing device includes a mobile telephone, laptop, tablet, computing pad, netbook, gaming device, and/or portable media player. The computing device 201 may also include less portable devices such as desktop personal computers, kiosks, tabletop devices, and the like. Additionally, the computing device 201 may represent a group of processing units or other computing devices.

In some examples, the computing device 201 has at least one processor 202, a memory area 206, and at least one user interface 204. The processor 202 includes any quantity of processing units, and is programmed to execute computer-executable instructions for implementing aspects of the disclosure. The instructions may be performed by the processor 202 or by multiple processors executing within the computing device 201, or performed by a processor external to the computing device 201. In some examples, the processor 202 is programmed to execute instructions such as those illustrated in the figures (e.g., FIG. 4) and/or to implement the diagram illustrated in FIG. 3.

In some examples, the processor 202 represents an implementation of analog techniques to perform the operations described herein. For example, the operations may be performed by an analog computing device and/or a digital computing device.

The computing device 201 further has one or more computer readable media such as the memory area 206. The memory area 206 includes any quantity of media associated with or accessible by the computing device 201. The memory area 206 may be internal to the computing device 201 (as shown in FIG. 2), external to the computing device 201, or both. In some examples, the memory area 206 includes read-only memory and/or memory wired into an analog computing device.

The memory area 206 stores, among other data, one or more applications 210. The applications 210, when executed by the processor 202, operate to perform functionality on the computing device 201. Exemplary applications 210 include mail application programs, web browsers, calendar application programs, audio and or video communication applications, address book application programs, messaging programs, media applications, location-based services, search programs, and the like. The applications 210 may communicate with counterpart applications or services such as web services accessible via the network 106. For example, the applications 210 may represent downloaded client-side applications that correspond to server-side services executing in a cloud.

The memory area 206 further stores the long-term statistics 208 describing the reference signal 302, the near-end noise signal 304, and/or the error signal 306. The long-term statistics 208 in some examples are represented by an average value tier each of the signals. The long-term statistics 208 are calculated over at least a predefined threshold time period. For example, the long-term statistics 208 are calculated for a duration of the past 100 milliseconds during a conversation. in one example, the earlier values of the signals are discarded or otherwise not considered when calculating the long-term statistics 208. In another example, the long-term statistics 208 are calculated for the entire time period that the values of each signal are available (e.g., since the beginning of a conversation, or even the values from previous communications, such as those occurring in similar environments).

The memory area 206 further stores one or more computer-executable components. Exemplary components include a monitoring component 212, an instantaneous statistics component 214, a long-term statistics component 216, a calculation component 218, a sparseness component 220, and a verification component 222. The monitoring component 212, when executed by the processor 202 causes the processor 202 to determine a present value for the error signal 306 during a conversation. The instantaneous statistics component 214 when executed by the processor 202 causes the processor 202 to determine a first function based on the determined present value for the error signal 306 during the conversation.

The long-term statistics component 216 when executed by the processor 202 causes the processor 202 to determine a second function based on the long-term statistics 208 of the reference signal 302, the near-end noise signal 304, and the error signal 306. The calculation component 218 when executed by the processor 202 causes the processor 202 to calculate an adaptation coefficient, for the VSS adaptive filter 312, based at least on the determined first function and the determined second function. The adaptation coefficient calculated by the calculation component 218 is used by the VSS adaptive filter 312 to reduce the effect of the near-end noise signal 304 during the conversation.

In some examples, the calculation component 218 calculates the adaptation coefficient by applying weights to the first function determined by the instantaneous statistics component 214 and the second function determined by the long-term statistics component 216. The weights are applied to the first function and the second function based on their respective measures of confidence (e.g., 95% confidence level, etc.).

The sparseness component 220 when executed by the processor 202 causes the processor 202 to determine sparseness in the reference signal 302 and the near-end noise signal 304 in the time domain and the frequency domain. The verification component 222 when executed by the processor 202 causes the processor 202 to apply a white noise signal such that a level of the near-end noise signal 304 falls below a level of echo. Thus, in response to applying the white noise signal, the verification component 222 causes convergence, during the presence of constant double talk, using the calculated adaptation coefficient in the VSS adaptive filter 312.

The memory area 206 may store additional or fewer components. in some examples, the components stored by the memory area 206 may be further subdivided into separate components. For example, the calculation component 218 may include one or more of the following: an echo path modeling component (e.g., fed by the monitoring component 212 and/or the instantaneous statistics component 214), a filtering component, an adaptation component, an echo suppression component, a comfort noise generation component, and/or a final perceptual post processing component. Such exemplary components execute various portions of the functionality described herein.

In some examples, the memory area 206 further includes a communications interface component. The communications interface component includes a network interface card and/or computer-executable instructions (e.g., driver) for operating the network interface card. Communication between the computing device 201 and other devices may occur using any protocol or mechanism over any wired or wireless connection. In some examples, the communications interface is operable with near-field communication (NFC) tags.

In some examples, the memory area 206 further includes the user interface 204 or other user interface component. The user interface component further includes a graphics card for displaying data to the user and receiving data from the user. The user interface component may also include computer-executable instructions (e.g., a driver) for operating the graphics card. Further, the user interface component may include a display (e.g., a touch screen display or natural user interface) and/or computer-executable instructions (e.g., a driver) for operating the display. The user interface component may also include one or more of the following to provide data to the user or receive data from the user: speakers, a sound card, a camera, a microphone, a vibration motor, one or more accelerometers, a BLUETOOTH brand communication module, global positioning system (GPS) hardware, and/or a photoreceptive light sensor. For example, the user may input commands or manipulate data by moving the computing device 201 in a particular way.

Figure 3:
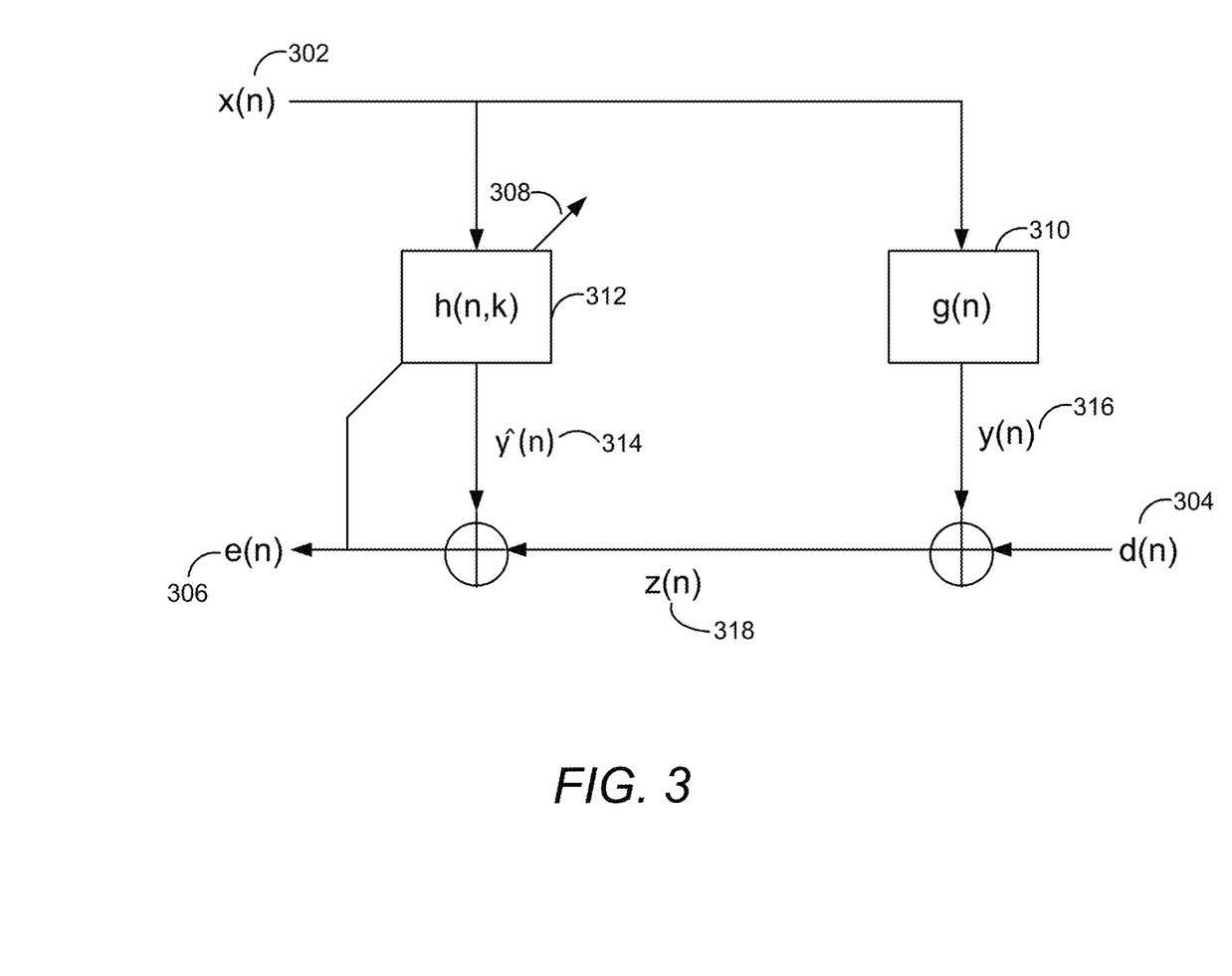
FIG. 3 is an exemplary block diagram illustrating adaptive filtering.

Referring next to FIG. 3, an exemplary block diagram illustrates adaptive filtering. In some examples, signals are already in the transform domain and only variables varying with time are described. The reference signal 302 represents far end signal and is denoted by x(n) in the example of FIG. 3, where n is a sampling time index. The near-end noise signal 304 represents the near-end noise signal and is denoted by d(n). The near-end noise signal 304 may be referred to as interference and includes near-end voice, noise, etc. Block 310 represents an impulse response of the true echo path and is denoted by g(n). Microphone signal 318, denoted by z(n), includes an echo signal 316 denoted by y(n) and the near-end noise signal 304. Signal 314 denoted by ŷ(n) is the synthesized echo. The error signal 306 denoted by e(n) contains the near-end noise signal 304 and residual echo ê(n) as shown in Equation (1) below.

$$ê(n)=y(n)-ŷ(n) \quad (1)$$

The block denoted by h(n,k) represents the adaptive filter 312 having length L. The function h(n,k) may be represented as a vector or an array. The time index and the tap index are n and k, respectively. Signal 308 represents a feedback loop of the adaptive filter 312. The adaptive filter 312 attempts to model the echo path of block 310 (e.g., h(n,k) learns and tries to become like g(n) using the signal 308 in the feedback loop). The adaptive filter 312 produces synthesized echo ŷ(n) so that it becomes like y(n). In such scenarios (when ŷ(n) becomes like y(n)), error signal e(n) contains the near-end noise signal d(n) (e.g., the near-end noise signal 304) only. The examples in the disclosure describe a method to eliminate or reduce the echo signal 316 contained in microphone signal z(n) (318).

The reference signal 302 and the near-end noise signal 304 is sparse in both time domain and frequency domain. Examples of the disclosure implement a. continuous adaptation rate that is a function of both present value of the error signal 306 and the long-term statistics 208 of the reference signal 302.

The adaptive filter 312 at time index n+1 and tap index k is defined as shown in Equation (2) below.

$$h(n+1, k)=h(n, k)+\mu(n)e(n)^*x(n-k) \quad (2)$$

The adaptation coefficient μ(n) is defined as shown in Equation (3) below.

$$\mu(n)=f(P_x^{avg}(n), P_e^{ins}(n, t)) \quad (3)$$

An example of the function from Equation (3) above is shown in Equation (4) below.

$$f(P_x^{avg}(n), P_e^{ins}(n, 2)) = \frac{1}{a(n) * P_x^{avg}(n) + b(n)P_e^{ins}(n, 2)} \quad (4)$$

The functions a(n) and b(n) are defined as shown in Equations (5) and (6) below with E being expectation operation.

$$a(n) = \left(\frac{E_{xx}(n)E_{ee}(n)}{E_{xe}(n)E_{xe}^*(n)}\right)^q \quad (5)$$

$$b(n) = \gamma \frac{E_{xx}(n)}{E_{ee}(n)}(a(n))^\rho \quad (6)$$

The contribution of an exemplary first function (e.g., F1) is represented by b(n)$P_e^{ins}$(n, 2) and the contribution of an exemplary second function (e.g., F2) is represented by a(n) * $P_x^{avg}$(n). Thus, the adaptation coefficient is defined as shown in Equation (7) below.

$$\mu(n) = \frac{1}{F2+F1} \quad (7)$$

The first function F1 represents contribution from the instantaneous error signal 306 and may be modeled as shown in Equation (8) below.

$$P_e^{ins}(n, t)=|e(n)|^t \quad (8)$$

The second function F2 represents the long-term statistics 208 of the reference signal 302 and may be modeled as shown in Equation (9) below.

$$P_x^{avg}(n) = \frac{\sum_{l=0}^{L-1}|x(n-l)|^2}{L} \quad (9)$$

In parameter b(n), the threshold γ controls the influence of the present value of the error signal $P_e^{ins}$(n, 2) on the adaptation coefficient. The threshold γ controls the trade-off between convergence speed during initial state or after an echo path change versus steady state residual during double talk. When the threshold γ is small, convergence is fast but steady state residual echo during double talk may be large due to contribution of $P_e^{ins}$(n, 2). When the threshold γ is large, initial convergence is slow, but convergence is deep during double talk.

The ratio $$\frac{E_{xx}(n)}{E_{ee}(n)}$$

in b(n) accounts for the combined attenuation of echo return loss enhancement (ERLE) and (echo return loss) ERL. This ratio normalizes the impact of present value of the error signal 306. For example, if there is no interference signal and the echo signal 316 is larger than the reference signal 302, μ(n) is mostly controlled by $P_e^{ins}$(n, 2), which is large in this case. Hence, the effect of $P_e^{ins}$(n, 2) is normalized to the level of the reference signal 302 so that the algorithm follows the NLMS rule when there is no interference. That is, the denominator is affected by $P_x^{avg}$(n).

The term (a(n))$^\rho$ in b(n) controls the speed of application of $P_e^{ins}$(n, 2) as a function of the convergence depth. The value of the term (a(n))$^\rho$ increases with the convergence depth. The parameter ρ controls a growth rate of a(n), which in turn may adversely impact the convergence rate. An example value of the parameter ρ is 0.5.

As per Cauchy-Schwarz inequality, the value of a(n) is always greater than or equal to one. The value of a(n) increases with convergence of the adaptive filter 312 and also with increases in the near-end noise signal 304. Thus, the value of the adaptation coefficient μ(n) decreases with the convergence of the adaptive filter 312 and with increases in the near-end noise signal 304 (e.g., with increases in the value of a(n)).

The value of the adaptation coefficient considers, or is otherwise affected by, the present value of the error signal 306. The present value represented by the first function b(n) $P_e^{ins}(n, 2)$ results in a calculation of the adaptation coefficient $\mu(n)$ that results in better EC over the previous systems by considering the present values along with the long-term statistics 208. The calculation results in better EC in various scenarios such as when a strong interference (e.g., constant double talk) comes after a long echo-only period. The adaptive filter 312 also converges better than the previous systems when the long-term statistics 208 are not available (e.g., at the start of a conversation, just after a reboot of the system, or in the case of sudden echo path changes, and more).

Figure 4:
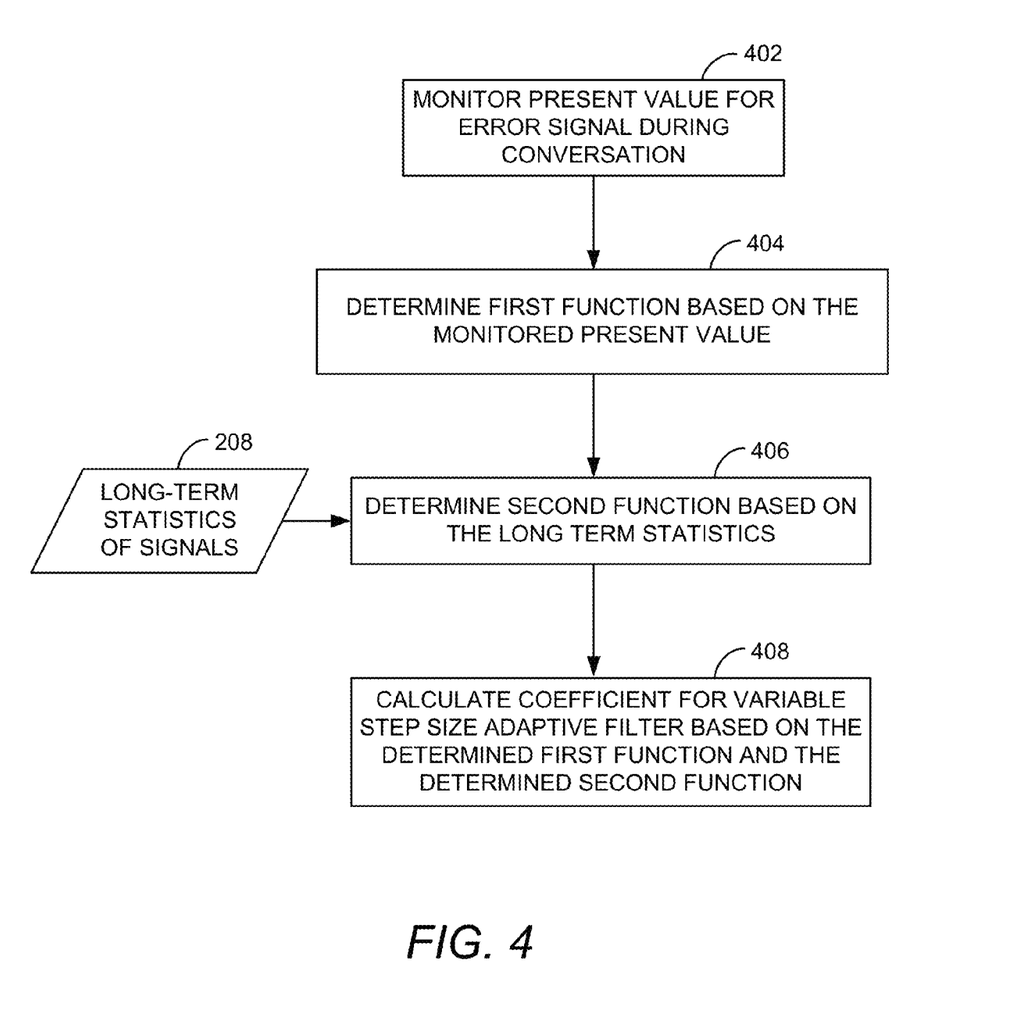
FIG. 4 is an exemplary flow chart illustrating operation of the computing device for reducing the effect of a near-end noise signal via VSS adaptive filtering.

Referring next to FIG. 4, an exemplary flow chart illustrates operations for calculating the adaptation coefficient for the VSS adaptive filter 312 for reducing the effects of the near-end noise signal 304. At 402, the present value of the error signal 306 during a conversation is monitored. The present value represents the instantaneous or current value of the error signal 306. At 404, a first function is determined based on the monitored present value of the error signal 306. At 406, a second function is determined based on the long-term statistics 208 describing the reference signal 302, the near-end noise signal 304, and the error signal 306. The long-term statistics 208, as an example, include average values of each of the reference signal 302, the near-end noise signal 304, and the error signal 306. Other ways of statistically representing the long-term values of the signals, such as mean, median, and the like are also within the scope of the disclosure. The first function and the second function are weighted by their respective measures of confidence.

In some examples, sparseness in the reference signal 302 and the near-end noise signal 304 is determined in a time domain and a transform domain. The transform domain is not limited to the frequency domain. The transform domain may include any type of transform.

At 408, the adaptation coefficient is calculated, for the VSS adaptive filter 312, based on the determined first function at 404 and the determined second function at 406. The calculated adaptation coefficient is used by the VSS adaptive filter 312. While the adaptive filter 312 may operate in conjunction with a double talk detector, the adaptive filter 312 may also operator without explicitly using the double talk detector. Exclusion of the double talk detector does not reduce performance of the adaptive filter 312.

In some examples, independence of adjacent transform bands in the conversation is determined. In response to determining that the adjacent bands are not independent, the first function and the second function are determined by considering information from adjacent sub-bands in the conversation. If the adjacent bands are determined to be independent, the information from the adjacent sub bands is not included in the calculation of the first function and the second function.

In some examples, white noise (e.g., a random signal with a constant power spectral density) is applied such that the level of the near-end noise signal 304 falls below the level of echo (e.g., echo to interference ratio becomes less than zero). Responsive to applying the white noise, the VSS adaptive filter 312 converges in the presence of double talk using the calculated adaptation coefficient.

FIGS. 5A, 5B, 6A, 6B, and 7 illustrate performance of an exemplary system implementing the operations described herein. For comparison purposes, the same set of parameters is used in each of these figures. For example, the adaptation coefficient in NLMS is chosen to be 0.05 to balance convergence rate and steady state residue with interference. An echo path has a simulated impulse response with 512 taps in which ERL is between 5 to 6 dB. Exemplary values of other parameters include q =0.85 and $\rho$=1.2. When average error power is less than or equal to twice the average microphone power, $\gamma$ is set to 1. Otherwise, $\gamma$ is set to 0.25. Input signals are all white noise unless specified otherwise. For example, both echo and interference signal (e.g., the reference signal 302 and the near-end noise signal 304) are white noise. Performance of the adaptive filter 312 is measured by ERLE as a function of time, computed such as 10 log 10($E_{yy}/E_{ee}$). The simulation parameters are selected to offer a sensible balance among various performance measures, although other parameters are contemplated.

Figure 5A:
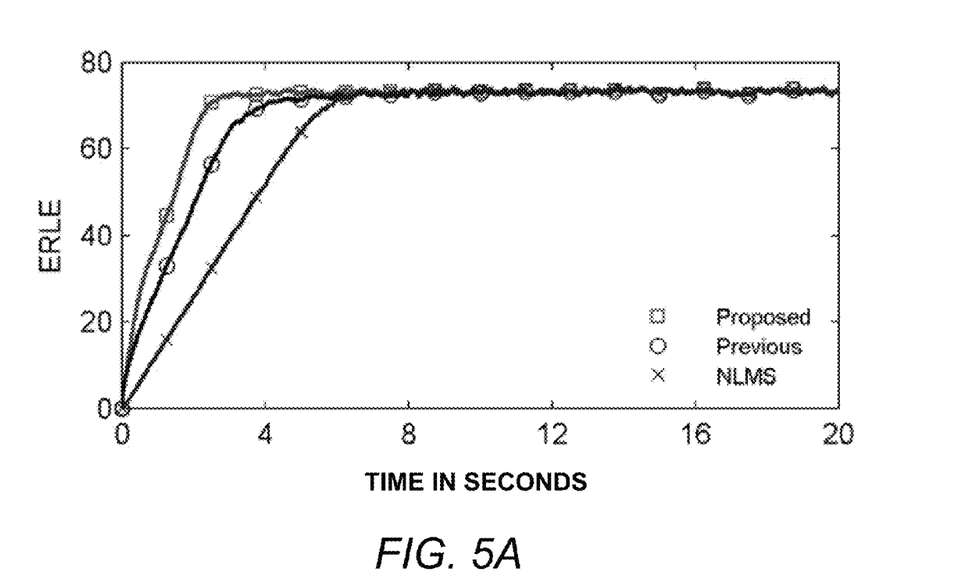
FIG. 5A illustrates exemplary convergence behavior comparison in the absence of a near-end noise signal.
Figure 5B:
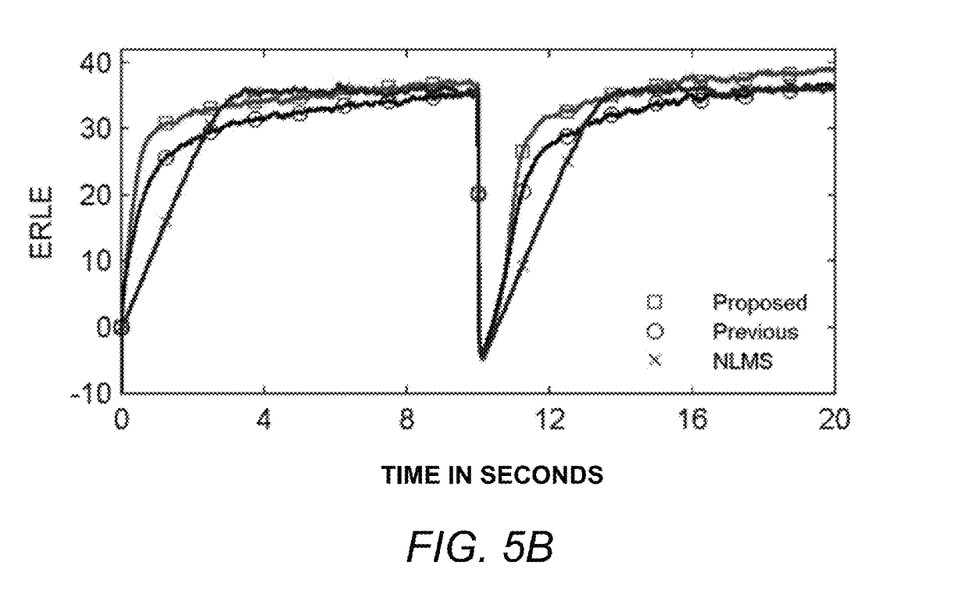
FIG. 5B illustrates exemplary convergence behavior when the near-end noise signal is lower than the echo by 20 dB (e.g., echo to interference ratio (ER) is 20 dB).

Referring next to FIG. 5A, an exemplary convergence behavior comparison in the absence of the near-end noise signal 304 is illustrated. The exemplary plot of ERLE as a function of time illustrates better performance of the system described herein as compared to the previous systems. FIG. 5B illustrates an exemplar convergence behavior when the near-end noise signal 304 is lower than echo by 20 dB (e.g., the EIR is 20 dB). Due to the constant adaptation coefficient for NLMS, the convergence rate of the NLMS algorithm in FIG. 5B is almost linear below three seconds and the convergence rate is almost zero after three seconds. In the examples described herein, convergence behavior is similar to the initial state even after the addition of an echo path change after eight seconds, such as shown in FIG. 5B.

Figure 6A:
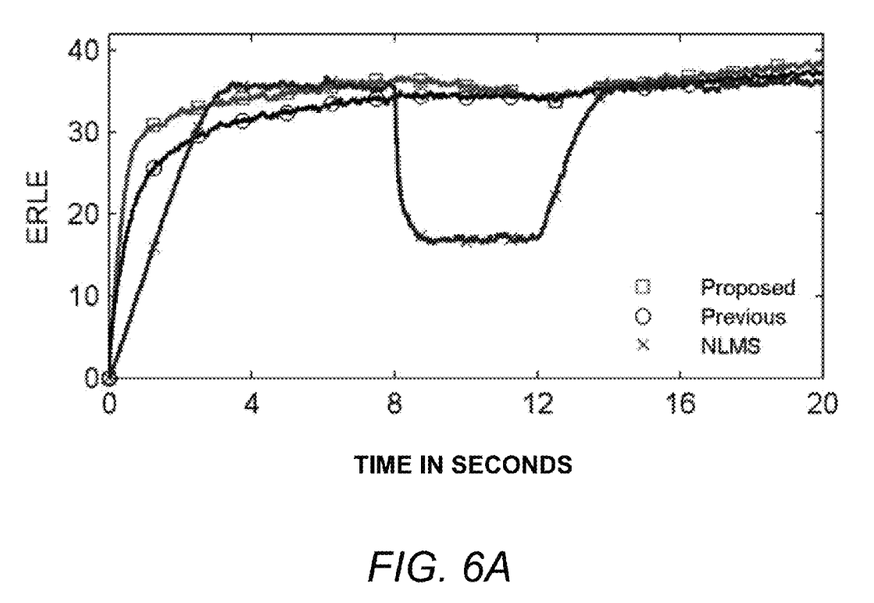
FIG. 6A illustrates an exemplary performance comparison of the system with a signal to noise ratio (SNR) of 20 dB and an EIR of 0 dB for double talk between 8 and 12 seconds.
Figure 6B:
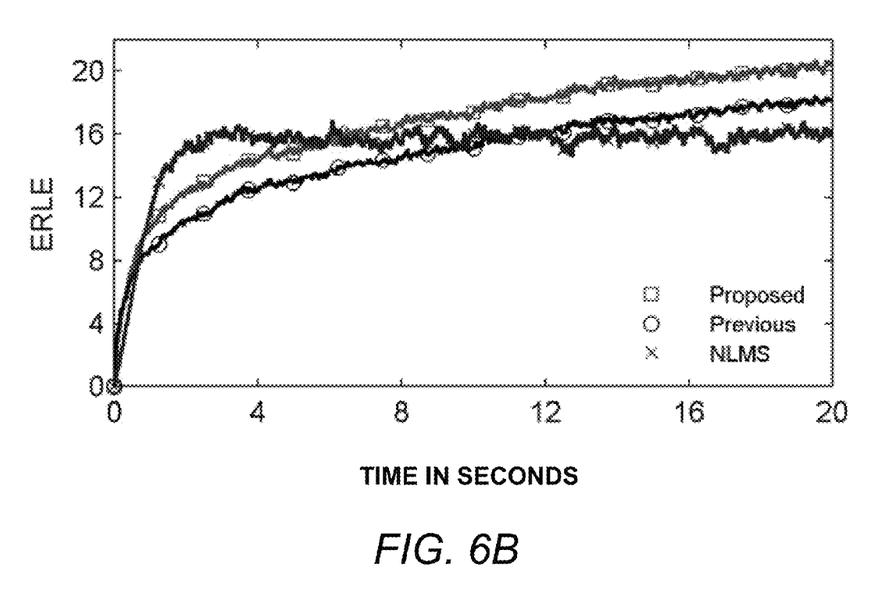
FIG. 6B illustrates an exemplary performance comparison of the system in the presence of constant double talk with an EIR of 0 dB.

Referring next to FIG. 6A, an exemplary performance comparison with a signal to noise ratio (SNR) of 20 dB and UR of 0 dB for double talk between 8 to 12 seconds is illustrated. In presence of double talk, NLMS has the worst performance while the VSS adaptive filter 312 of the system described herein offers the best performance. if an attempt is made to increase the convergence rate by retuning the parameters q, $\rho$, and $\gamma$, it may result in an increase in the divergence rate with strong interference. FIG. 6B illustrates a performance comparison in the presence of constant double talk with EIR of 0 dB. if a double talk detector is used in such a scenario, the echo canceller will never converge. While sonic of the previous VSS algorithms converge reasonably fast when the initial adaptation coefficient is set to a large value (in case of lower value, the convergence will be slow in the previous VSS algorithms), the VSS operations implemented by the system described herein are resilient against the initial value selected for the adaptation coefficient.

Figure 7:
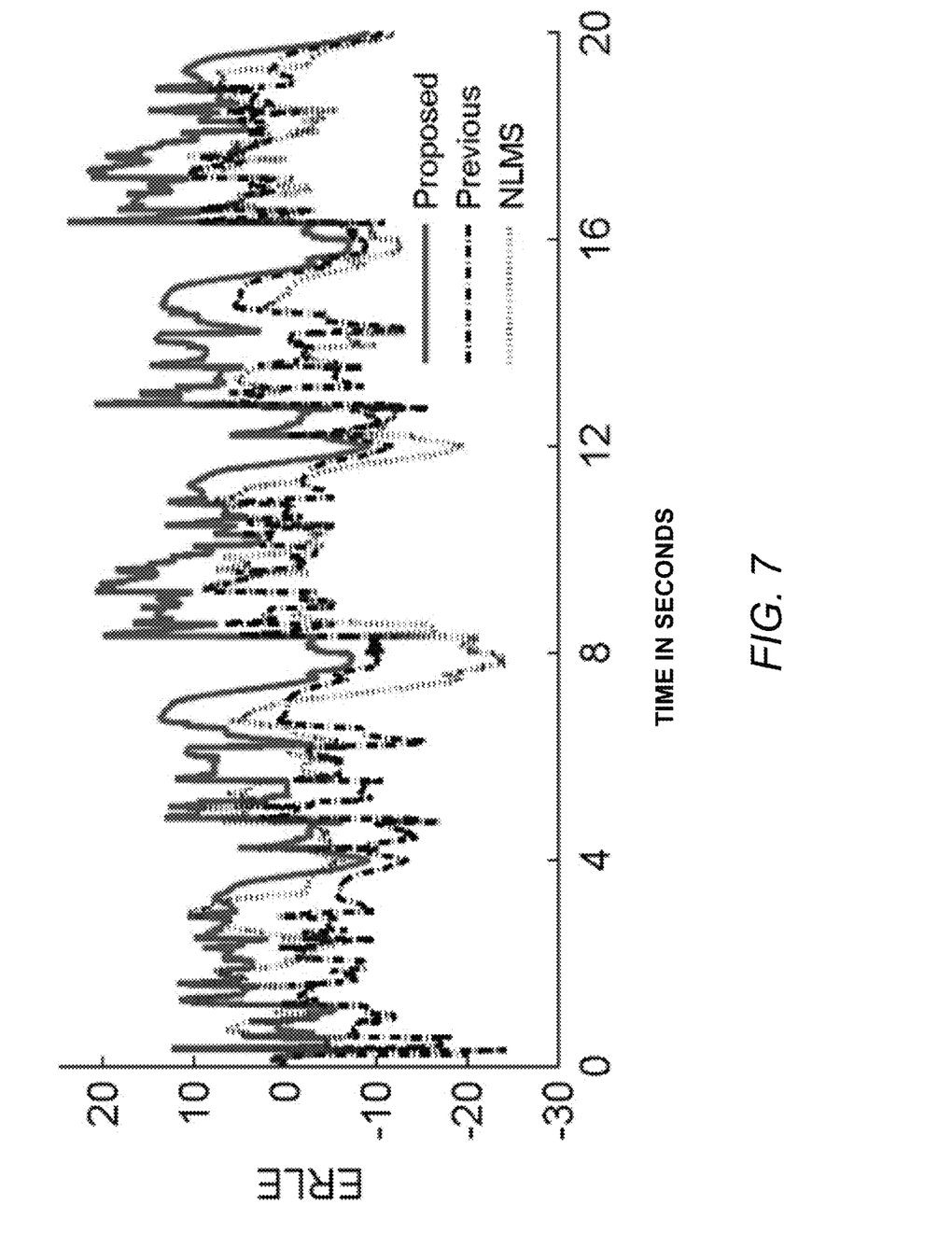
FIG. 7 illustrates higher echo return loss enhancement (ERLE) for voice inputs in the system.

FIG. 7 illustrates that the exemplary aspects of the disclosure offer higher ERLE for voice inputs. Metrics such as subjective listening and misalignment measured as a function of time confirm that the examples of the disclosure are more robust to interference and offer better subjective signal quality. The examples of the disclosure outperform the previous VSS algorithm at least in terms of speed and depth of convergence as well as resilience to the double talk and echo path change.

Figure 8:
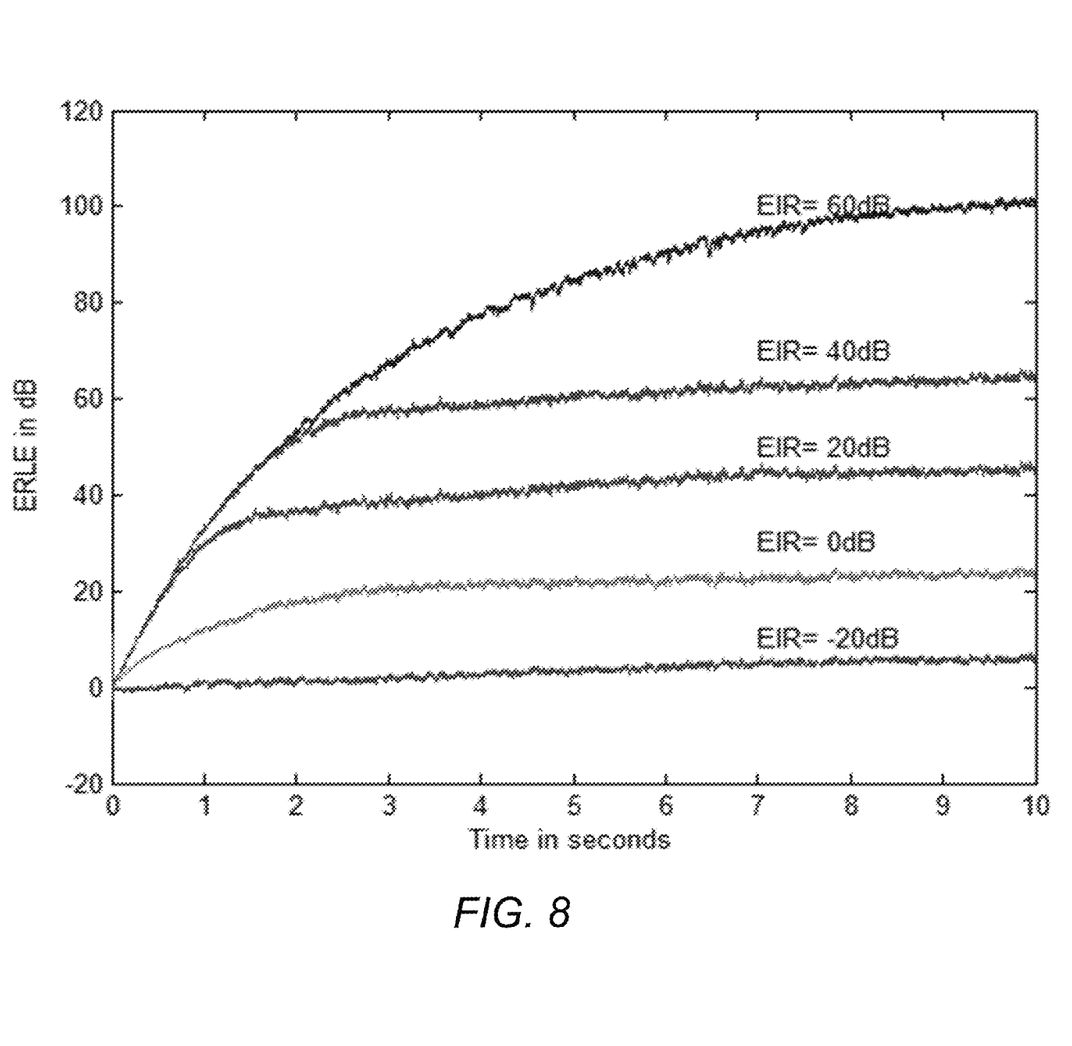
FIG. 8 illustrates exemplary performance results for the system at difference values of EIR.

FIG. 8 illustrates the exemplary performance results for the present disclosure at difference values of EIR. White noise is applied at both the far end as well as the near-end by their respective speakers such that the level of the nearend noise signal 304 falls below the level of echo. The adaptive echo canceller converges under this scenario. This confirms that both the long-term statistics 208 and the present values of the near-end noise signal 304 are used by the examples of the disclosure. Other echo cancellers not using the examples of the disclosure will not converge.

While the aspects of the disclosure have been described in terms of various examples with their associated operations, a person skilled in the art will appreciate that a combination of operations from any number of different examples is also within scope of the aspects of the disclosure.

ADDITIONAL EXAMPLES

In some examples, when multiple microphones are used, the values of F1 and F2 from the same band across multiple microphones may be merged or otherwise combined to exploit spatial information. For multiple microphones, the distance between the speaker and the microphones is different than the distance from the user to the microphones. As such, the change in magnitude and/or phase of the echo as seen by the microphones is different from the change in magnitude and/or phase of the user speech. In some examples, this information is combined with the time/frequency domains to add robustness in exploiting sparseness of the signals.

In an example scenario, aspects of the disclosure allow a user to reduce reliance on a double talk detector and a dual filter for echo cancellation. While aspects of the disclosure are usable without the double talk detector and the dual aspects of the disclosure may be used with either or both the double talk detector and the dual filter.

At the beginning of the conversation or under conditions such as echo path change (e.g., echo path may change by putting a mobile telephone upside down on the table), the VSS adaptive filter 312 performs better than the previous systems.

Alternatively or in addition to the other examples described herein, examples include any combination of the following:
- wherein the processor is further programmed to weight the first function and the second function by their respective measures of confidence.
- wherein the processor is further programmed to update, in real-time, a previously-calculated adaptation coefficient with the calculated adaptation coefficient.
- wherein the processor is further programmed to determine sparseness, in the reference signal and in the near-end noise signal, in a time domain and a transform domain.
- wherein the transform domain comprises at least one of a frequency domain or an orthonormal transform.
- wherein the system further comprises at least two microphones, and wherein the processor is programmed to determine sparseness by determining a difference in a magnitude or a phase of echo signal for the at least two microphones and determining a difference in a magnitude or a phase of user speech for the at least two microphones.
- wherein the processor is further programmed to:
  - determine whether adjacent bands in the conversation are independent; and
  - upon determining that the adjacent bands are not independent, determine the first function and the second function by incorporating information from adjacent sub-bands in the conversation.
- wherein the processor is further programmed to:
  - apply a white noise signal such that a level of the near-end noise signal falls below a level of echo; and
  - in response to applying the white noise signal, converge in the presence of constant double talk using the calculated adaptation coefficient in the VSS adaptive filter.
- wherein the stored long-term statistics comprise an average value of each of the reference signal, the near-end noise signal, and the error signal for at least a threshold time period.
- wherein the threshold time period is immediately before said monitoring the present value for the error signal.

At least a portion of the functionality of the various elements shown in the figures may he performed by other elements in the figures, or an entity (e.g., processor, web service, server, application program, computing device, etc.) not shown in the figures.

In some examples, the operations illustrated in the figures may be implemented as software instructions encoded on a computer readable medium, in hardware programmed or designed to perform the operations, or both. For example, aspects of the disclosure may be implemented as a system on a chip or other circuitry including a plurality of interconnected, electrically conductive elements.

While no personally identifiable information is tracked by aspects of the disclosure, examples have been described with reference to data monitored and/or collected from the users. In some examples, notice may be provided to the users of the collection of the data (e.g., via a dialog box or preference setting) and users are given the opportunity to give or deny consent for the monitoring and/or collection. The consent may take the form of opt-in consent or opt-out consent.

Aspects of the disclosure are operable with devices having multiple microphones. For example, in a device having N loudspeakers (e.g., N>1) and microphones (e.g., M>1), the operations described herein are applied to each pair of a speaker (n) and a microphone (m) where $1<=n<=N$ and $1<=m<=M$. The statistics of the independent channels (e.g., pairs) may be combined to generate additional statistics thus forming a robust and reliable calculation. For example, the adaptation coefficients from each of the pairs may be combined to produce a combined adaptation coefficient. The statistics may be combined in various ways depending on device geometry, microphone and speaker placement, etc. Alternatively or in addition, to save computation and memory, the statistics from only a few loudspeaker/microphone pairs (n, m) may be combined and then extrapolated to compute (or approximate) the VSS for other channels.

Similarly, when analyzing a single loudspeaker/microphone pair, various frequency bins (e.g., sub-bands) may be analyzed and the statistics combined therefrom. For example, the loudspeaker/microphone pair may be operated in each bin or band independently, the statistics from multiple bands/bins then combined, and the calculations from a subset of bands/bins extrapolated to other bins/bands thereby saving power and/or memory usage. Similar operations may be performed for a given frequency bin/band across sets of loudspeaker/microphone (n,m) pairs.

Exemplary Operating Environment

Exemplary computer readable media include flash memory drives, digital versatile discs (DVDs), compact discs (CDs), floppy disks, and tape cassettes. By way of example and not limitation, computer readable media comprise computer storage media and communication media. Computer storage media include volatile and nonvolatile, removable and non-removable media implemented in any method or technology for storage of information such as computer readable instructions, data structures, program modules or other data. Computer storage media are implemented in hardware and exclude carrier waves and propagated signals. Computer storage media for purposes of this disclosure are not signals per se. Exemplary computer storage media include hard disks, flash drives, and other solid-state memory. In contrast, communication media typically embody computer readable instructions, data structures, program modules, or other data in a modulated data signal such as a carrier wave or other transport mechanism and include any information delivery media.

Although described in connection with an exemplary computing system environment, examples of the disclosure are capable of implementation with numerous other general purpose or special purpose computing system environments, configurations, or devices.

Examples of well-known computing systems, environments, and/or configurations that may be suitable for use with aspects of the invention include, but are not limited to, mobile computing devices, personal computers, server computers, hand-held or laptop devices, multiprocessor systems, gaming consoles, microprocessor-based systems, set top boxes, programmable consumer electronics, mobile telephones, mobile computing and/or communication devices in wearable or accessory form factors (e.g., watches, glasses, headsets, or earphones), network PCs, minicomputers, mainframe computers, distributed computing environments that include any of the above systems or devices, and the like. Such systems or devices may accept input from the user in any way, including from input devices such as a keyboard or pointing device, via gesture input, proximity input (such as by hovering), and/or via voice input. Aspects of the disclosure are also operable with devices used for voice communications in any environment (e.g., medical, military, recreational, etc.).

Examples of the disclosure may be described in the general context of computer-executable instructions, such as program modules, executed by one or more computers or other devices in software, firmware, hardware, or a combination thereof. The computer-executable instructions may be organized into one or more computer-executable components or modules. Generally, program modules include, but are not limited to, routines, programs, objects, components, and data structures that perform particular tasks or implement particular abstract data types. Aspects of the invention may be implemented with any number and organization of such components or modules. For example, aspects of the invention are not limited to the specific computer-executable instructions or the specific components or modules illustrated in the figures and described herein. Other examples may include different computer-executable instructions or components having more or less functionality than illustrated and described herein.

Aspects of the invention transform a general-purpose computer into a special-purpose computing device when configured to execute the instructions described herein.

The examples illustrated and described herein as well as examples not specifically described herein but within the scope of aspects of the invention constitute exemplary means for echo filter convergence in the presence of constant double talk using the VSS adaptive filter. For example, the elements illustrated in FIG. 2 and/or FIG. 3, such as when encoded to perform the operations illustrated in FIG. 4, constitute exemplary means for monitoring a present value for an error signal during a conversation, exemplary means for determining a first function based on the monitored present value for the error signal, exemplary means for determining a second function based on long-term statistics for a reference signal, a near-end noise signal, and the error signal, and exemplary means for calculating an adaptation coefficient for the VSS adaptive filter based on the determined first function and the determined second function, wherein the calculated adaptation coefficient is used by the VSS adaptive filter for reducing the near-end noise signal during the conversation.

The order of execution or performance of the operations in examples of the disclosure illustrated and described herein is not essential, unless otherwise specified. That is, the operations may be performed in any order, unless otherwise specified, and examples of the disclosure may include additional or fewer operations than those disclosed herein. For example, it is contemplated that executing or performing a particular operation before, contemporaneously with, or after another operation is within the scope of aspects of the invention.

When introducing elements of aspects of the disclosure or the examples thereof, the articles "a," "an," "the," and "said" are intended to mean that there are one or more of the elements. The terms "comprising," "including," and "having" are intended to be inclusive and mean that there may be additional elements other than the listed elements. The term "exemplary" is intended to mean "an example of." The phrase "one or more of the following: A, B, and C" means "at least one of A and/or at least one of B and/or at least one of C."

Having described aspects of the invention in detail, it will be apparent that modifications and variations are possible without departing from the scope of aspects of the invention as defined in the appended claims. As various changes could be made in the above constructions, products, and methods without departing from the scope of aspects of the invention, it is intended that all matter contained in the above description and shown in the accompanying drawings shall be Interpreted as illustrative and not in a limiting sense.

What is claimed is:

1. A system capable of converging in the presence of constant double talk using a variable step size (VSS) adaptive filter, said system comprising:
    a memory area for storing long-term statistics describing a reference signal, a near-end noise signal, and an error signal; and
    a processor programmed to:
        monitor a present value corresponding to the error signal during a conversation;
        determine a first function based on the monitored present value for the error signal;
        determine a second function based on the stored long-term statistics; and
        calculate, based on applying a first weight to the determined first function and a second weight to the determined second function, an adaptation coefficient for the VSS adaptive filter, the first weight and the second weight representing a level of confidence in the first function and the second function, respectively; and
        reduce the near-end noise signal during the conversation by applying the calculated adaptation coefficient to the VSS adaptive filter.

2. The system of claim 1, wherein the processor is further programmed to update, in real-time, a previously-calculated adaptation coefficient with the calculated adaptation coefficient.

3. The system of claim 1, wherein the processor is further programmed to determine sparseness, in the reference signal and in the near-end noise signal, in a time domain and a transform domain.

4. The system of claim 3, wherein the transform domain comprises at least one of a frequency domain or an orthonormal transform.

5. The system of claim 3, wherein the system further comprises at least two microphones, and wherein the processor is programmed to determine sparseness by determining a difference in a magnitude or a phase of echo signal for the at least two microphones and determining a difference in a magnitude or a phase of user speech for the at least two microphones.

6. The system of claim 1, wherein the processor is further programmed to:
   determine whether adjacent bands in the conversation are independent; and
   upon determining that the adjacent bands are not independent, determine the first function and the second function by incorporating information from adjacent sub-bands in the conversation.

7. The system of claim 1, wherein the processor is further programmed to:
   apply a white noise signal such that a level of the near-end noise signal falls below a level of echo; and
   in response to applying the white noise signal, converge in the presence of constant double talk using the calculated adaptation coefficient in the VSS adaptive filter.

8. The system of claim 1, wherein the stored long-term statistics comprise an average value of each of the reference signal, the near-end noise signal, and the error signal for at least a threshold time period.

9. The system of claim 8, wherein the threshold time period is immediately before said monitoring the present value for the error signal.

10. The system of claim 1, wherein the long-term statistics correspond to the reference signal, the near-end noise signal, and the error signal for one or more of the following: a current conversation, over a predefined number of conversations, since a last reboot of a computing device, and since the computing device started monitoring.

11. A method comprising:
   monitoring, by a processor associated with a computing device, a present value for an error signal during a conversation;
   determining a first function based on the monitored present value for the error signal;
   determining a second function based on long-term statistics for a reference signal, a near-end noise signal, and the error signal; and
   calculating an adaptation coefficient for a variable step size (VSS) adaptive filter based on the determined first function and the determined second function, wherein the calculated adaptation coefficient is used by the VSS adaptive filter for reducing the near-end noise signal during the conversation.

12. The method of claim 11, further comprising weighting the first function and the second function by their respective measures of confidence.

13. The method of claim 11, further comprising determining sparseness in the reference signal and the near-end noise signal in a time domain and a transform domain.

14. The method of claim 11, wherein the computing device has a plurality of pairs of speakers and microphones, and wherein said monitoring, said determining the first function, said determining the second function, and said calculating are performed for each of the plurality of pairs, and further comprising combining statistics generated from calculating the adaption coefficient for each of the plurality of pairs to produce a combined adaptation coefficient.

15. The method of claim 11, further comprising:
   determining whether adjacent bands in the conversation are independent; and
   upon determining that the adjacent bands are not independent, determining the first function and the second function with data from adjacent sub-bands in the conversation.

16. The method of claim 11, further comprising:
   applying a white noise signal such that a level of the near-end noise signal falls below a level of echo; and
   in response to applying the white noise signal, converging in the presence of constant double talk using the calculated adaptation coefficient in the VSS adaptive filter.

17. A computer storage media storing computer executable components executable by a processor associated with a computer device, said components comprising:
   a monitoring component that when executed by at least one processor causes the at least one processor to determine a present value for an error signal during a conversation;
   an instantaneous statistics component that when executed by at least one processor causes the at least one processor to determine a first function based on the determined present value for the error signal during the conversation;
   a long-term statistics component that when executed by at least one processor causes the at least one processor to determine a second function based on long-term statistics of each of a reference signal, a near-end noise signal, and the error signal; and
   a calculation component that when executed by at least one processor causes the at least one processor to calculate, based on the determined first function and the determined second function, an adaptation coefficient for use in a variable step size (VSS) adaptive filter,
   wherein the adaptation coefficient calculated by the calculation component is used in the VSS adaptive filter for reducing the near-end noise signal during the conversation.

18. The computer storage media of claim 17, wherein the calculation component calculates the adaptation coefficient by applying a weight to the first function determined by the instantaneous statistics component and another weight to the second function determined by the long-term statistics component.

19. The computer storage media of claim 17, further comprising a sparseness component that when executed by at least one processor causes the at least one processor to determine sparseness in the reference signal and in the near-end noise signal in a time domain and a frequency domain.

20. The computer storage media of claim 17, further comprising a verification component that when executed by at least one processor causes the at least one processor to apply a white noise signal such that a level of the near-end noise signal falls below a level of echo, wherein the verification component causes, in response to applying the white noise signal, convergence during constant double talk using the calculated adaptation coefficient in the VSS adaptive filter.

* * * * *